United States Patent
Kato et al.

[11] Patent Number: 6,113,835
[45] Date of Patent: Sep. 5, 2000

[54] METHOD OF PROCESSING A RESIN SHEET WITH A LASER BEAM

[75] Inventors: Shigeya Kato, Kariya; Yasutaka Kamiya, Okazaki; Takashi Ogata, Kariya; Takashi Hiraiwa, Anjo, all of Japan

[73] Assignee: Denso Corporation, Kariya, Japan

[21] Appl. No.: 09/028,454

[22] Filed: Feb. 24, 1998

[30] Foreign Application Priority Data

Feb. 26, 1997 [JP] Japan .................................. 9-059770

[51] Int. Cl.[7] .................................................. B23K 26/00
[52] U.S. Cl. ............... 264/400; 219/121.66; 219/121.69; 264/482
[58] Field of Search .................................. 264/400, 482; 219/121.67, 121.68, 121.69, 121.7, 121.72, 121.66

[56] References Cited

U.S. PATENT DOCUMENTS

| | | | |
|---|---|---|---|
| 3,435,186 | 3/1969 | Roshon, Jr. et al. | 219/121.69 |
| 3,790,744 | 2/1974 | Bowen | 264/400 |
| 4,854,974 | 8/1989 | Carlson et al. | |
| 5,018,817 | 5/1991 | Suzuki et al. | |
| 5,227,098 | 7/1993 | Philby et al. | 264/400 |
| 5,229,180 | 7/1993 | Littmann | 219/121.69 |

FOREIGN PATENT DOCUMENTS

| | | | |
|---|---|---|---|
| 2 690 862 | 11/1993 | France | 219/121.68 |
| 1-127188 | 5/1989 | Japan . | |
| 2-084282 | 3/1990 | Japan . | |
| 2-219651 | 9/1990 | Japan . | |
| 4-240793 | 8/1992 | Japan . | |
| 6-055283 | 3/1994 | Japan . | |

*Primary Examiner*—Mathieu D. Vargot
*Attorney, Agent, or Firm*—Pillsbury Madison & Sutro Intellectual Property Group

[57] ABSTRACT

A method of forming a separation groove and a ditch for cutting a thermoplastic resin sheet by a laser beam is performed as follows. A heat-resistant layer made of thermosetting resin is printed on the rear surface of the resin sheet along the line of the ditch to be formed by the laser beam. A laser beam is radiated on the front surface of the resin sheet and scanned along the line of the ditch and the separation groove. The laser beam melts and evaporates resin and forms the ditch and the separation groove. Since the rear end of the ditch is covered by the heat-resistant layer, the resin sheet is not completely separated along the ditch line, while it is separated along the separation groove line. At the final stage, the resin sheet is cut along the ditch line. A flexible circuit sheet for making electrical connection can be easily and cost effectively processed in this laser beam process.

6 Claims, 4 Drawing Sheets

METHOD OF PROCESSING A RESIN SHEET WITH A LASER BEAM

CROSS REFERENCE TO RELATED APPLICATION

This application is based upon and claims benefit of priority of Japanese Patent Application No. Hei-9-59770 filed on Feb. 26, 1997, the content of which is incorporated herein by reference.

BACKGROUND OF THE INVENTION

1. Field of the Invention

The present invention relates to a method of processing a resin sheet or forming ditches on the resin sheet by laser beam radiation and to a resin sheet or part manufactured by such a method. Such a resin sheet is used, for example, as a flexible circuit sheet for making an electrical connection in an instrument panel of an automotive vehicle.

2. Description of Related Art

A method of cutting a resin sheet such as a flexible circuit sheet with a laser beam or forming ditches on a part thereon has been known hitherto. In a conventional method of forming ditches on a resin sheet, as shown in FIG. 7, metal strip 91 is embedded in resin sheet 9 at the bottom of ditch 92 to be formed by laser radiation. A part of the resin where the laser beam is radiated is melt and evaporated, and the laser beam is reflected by metal strip 91 when it reaches metal strip 91 and there the laser beam radiation is stopped, thereby ditch 92 being formed. This method is disclosed in JP-A-2-84282. Another method disclosed in JP-A-2-219651 uses a heat-resistant resin plate in place of the metal strip. To cut partially a resin sheet only at desired positions, a method of controlling the laser beam in an ON and OFF fashion and radiating it intermittently is proposed in JP-A-6-55283.

Both methods disclosed in JP-A-2-84282 and JP-A-2-219651 for making ditches on a resin sheet require an embedded metal strip or heat-resistant plate. The method proposed in JP-A-6-55283 for partially cutting a resin sheet not only requires complex control of the laser beam but also prolongs the processing time. Therefore, productivity in those methods is not high, and accordingly the production cost becomes high.

For manufacturing a flexible circuit sheet, a method in which several flexible circuit sheets are formed on a single sheet and divided into individual circuit sheets by cutting the single sheet with a laser beam is also known. The individual circuit sheets and a part removed from the single sheet as waste are all completely separated in the laser beam processing. Therefore, it is necessary to prepare two conveyor systems to take out separately the circuit sheets as finished products and the sheet part removed as waste in a mass production process. Therefore, the conveyor system becomes complex and expensive.

SUMMARY OF THE INVENTION

The present invention has been made in view of the above-mentioned problems, and an object of the present invention is to provide an improved method of cutting a resin sheet with a laser beam in which no embedded metal strip or heat-resistant plate for terminating laser cutting is required while cut out sheet products and a waste sheet are loosely connected until they are finally separated. Also, the improved method provides a way of cutting only desired portions of a resin sheet with a continuous laser beam having a constant power level without controlling the laser beam in an ON-OFF fashion.

Another object of the present invention is to provide a resin sheet or part manufactured in the improved and economical method. The resin sheet or part may be used as an automotive part, such as a flexible circuit sheet for making electrical connection in an instrument panel, for example.

To eliminate the metal strip or the resin plate embedded in the thermoplastic resin sheet for terminating the laser cutting process, a heat-resistant layer made of thermosetting resin is formed on the rear surface of the thermoplastic resin sheet along a line of a ditch or a groove to be formed on the resin sheet. A laser beam is radiated on the front surface of the resin sheet, which is a surface opposite to the rear surface having the heat-resistant layer, and scanned along the line of the ditch or the groove. Upon radiation of the laser beam, the thermoplastic resin is melted and evaporated, thereby forming the ditch or the groove on the resin sheet. The power of the laser beam is so selected that it melts the thermoplastic resin but does not melt the heat-resistant layer formed on the rear surface of the resin sheet. The heat-resistant layer still keeps a fragile connection among cut out portions until the cut out portions are separated in a later process. Therefore, the resin sheet can be handled as a single piece after the laser beam processing. It is much easier and inexpensive to form the heat-resistant layer than to embed the metal strip or the resin plate in the resin sheet as done in the conventional method.

It is, of course, possible to make a separation groove which completely cuts away the resin sheet. In this case no heat-resistant layer is formed before the laser beam processing. If a portion or portions of the separation groove are desired to be left unprocessed by the laser beam, a heat-resistant strip made of thermosetting resin is formed on the front surface of the thermoplastic resin sheet. Upon radiation of the laser beam, the portion covered by the heat-resistant strip is left unprocessed while other portions are cut by the laser beam. In this manner, a partly connected separation groove can be formed by continuous radiation of the laser beam without controlling it in ON and OFF.

Preferably, the power of the laser beam is kept constant throughout the process to make the control system of the laser beam simple. The speed of scanning may be changed according to positions to be processed. For example, the portion covered by the heat-resistant strip where laser power is not required can be scanned at a higher speed, while other portions to be processed by the laser beam are scanned at a normal speed.

The laser beam processing according to the present invention can be applied to manufacturing a flexible circuit sheet used for making electrical connection in an instrument panel of an automotive vehicle. A circuit pattern made of a conductive material such as copper is printed on one surface of a thermoplastic flexible resin sheet. A continuous curved line encompassing the circuit area therein is set for making a ditch and a separation groove along the continuous curved line. A heat-resistant layer made of thermosetting resin is formed on the same surface to cover the area where the circuit pattern is printed and the part of the continuous line for the ditch. The laser beam is radiated on the other surface and scanned along the continuous curved line. By the laser beam, the ditch and the separation groove are formed on the thermoplastic resin sheet. The resin sheet is cut and separated along the separation groove while it is still fragilly connected along the ditch by the heat-resistant layer after the ditch is formed by the laser beam. Therefore, the resin sheet can be handled as a single piece after the laser processing. The flexible circuit sheet is separated from the resin sheet at a final stage of its manufacturing process.

Other objects and features of the present invention will become more readily apparent from a better understanding of the preferred embodiments described below with reference to the following drawings.

DETAILED DESCRIPTION OF THE PREFERRED EMBODIMENTS

Figure 1:
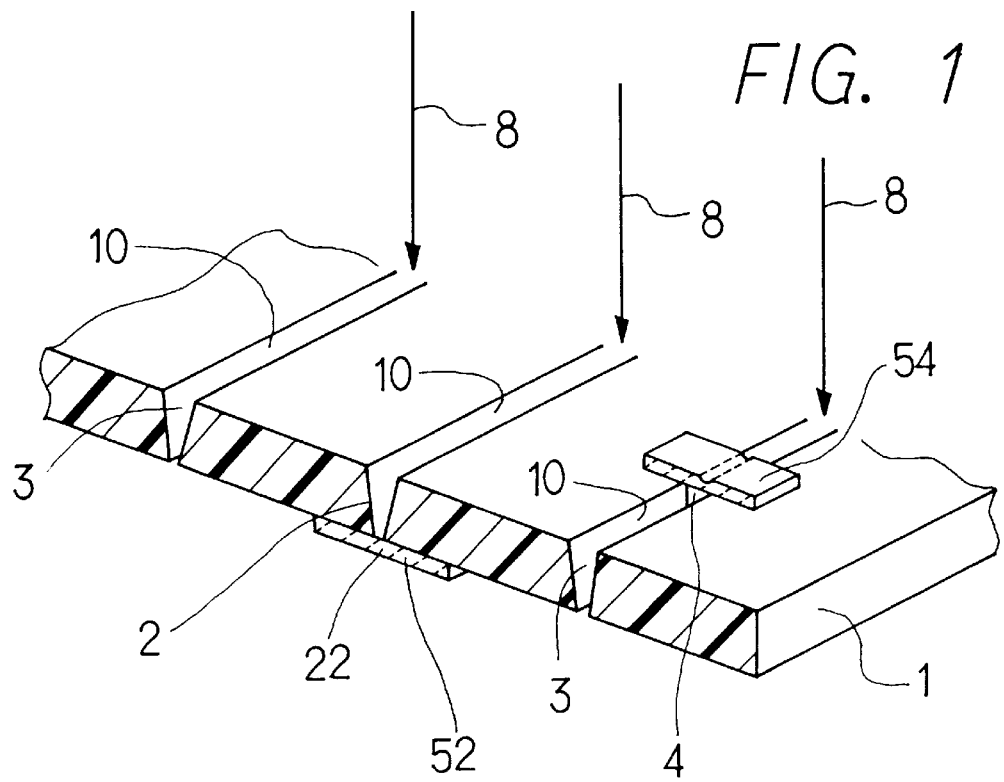
FIG. 1 is a perspective view of a resin sheet, as a first embodiment, showing separation grooves and ditches both formed by a laser beam and a heat resistant-strip placed on a front surface of the resin sheet.
Figure 2:
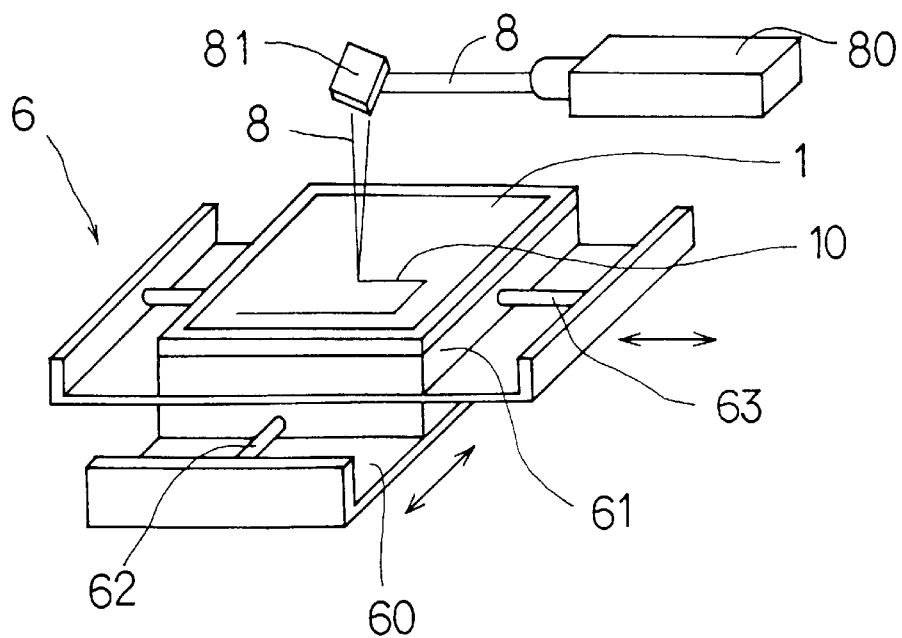
FIG. 2 is a perspective view showing a laser beam radiation apparatus used for making the resin sheet shown in FIG. 1.

Referring to FIGS. 1 and 2, a first embodiment according to the present invention will be described. Ditches 2, separation grooves 3 and other separation groove 3 which includes connecting portion 4 are all formed on resin sheet 1 by radiating laser beam 8.

Resin sheet 1 is 75 $\mu$m thick and made of thermoplastic polyester resin. Other resins such as polyamide or olefin may be also used, as long as they are melted and evaporated by radiating a laser beam thereon. Strip-shaped heat-resistant layer 52 is formed on rear surface 22 (or a first surface) of resin sheet 1 where ditch 2 is to be made. Heat-resistant layer 52 is formed by printing an ink of thermosetting resin and then heating the ink for causing a bridging reaction and hardening. Also, heat-resistant strip 54 is formed on the front surface (or a second surface) of resin sheet 1 where connecting portion 4 is to be formed. Heat-resistant strip 54 intercepts the laser beam so that the portion of the resin sheet having the heat-resistant strip remains unaffected by the laser beam. Heat-resistant strip 54 is formed in the same manner as heat-resistant layer 52. The thermosetting ink used here is the ink made of epoxy resin, and the thickness of heat-resistant layer 52 and heat-resistant strip 54 is about 13 $\mu$m. Ink made of other thermosetting resins such as phenol, melamine or silicone may be also used as long as they are not melted by the laser beam. The thermosetting ink in this embodiment is printed by a screen printing which is able to print precisely arbitrary patterns. However, other printing methods such as relief printing may be also used. After heat-resistant layers 52 and heat-resistant strips 54 are formed on the resin sheet surfaces to cover the desired positions, laser beam 8 is radiated and scanned in the direction along scanning lines 10 as shown in FIG. 1.

An example of a laser beam radiation apparatus is shown in FIG. 2. Laser beam radiation apparatus 6 includes X-Y table 61 driven by X-direction driving device 63 and Y-direction driving device 62 mounted on base 60, so that the laser beam can be radiated at any surface positions of resin sheet 1. The laser beam is generated in laser gun 80, reflected by beam reflection mirror 81 and continuously radiated at one point of resin sheet 1 placed on X-Y table 61. Since resin sheet 1 is moved by X-Y table, the laser beam can scan the resin sheet along programmed scanning line 10. A $CO_2$ laser having a 10.6 $\mu$m wave length is used in this embodiment. Other lasers such as CO, YAG and ruby lasers may also be used. The oscillation of the laser can be either continuous or pulsating. The laser beam having a constant power of 40 W is continuously radiated on the spot and scans the resin sheet along the scanning line at a speed of 27 m/minute.

Portions of the resin sheet where the laser beam is radiated are melted and evaporated, and thus ditches 2, separation grooves 3 and other separation grooves having connecting portion 4 are all formed as shown in FIG. 1. Separation grooves 3 having no strip intercepting the laser beam are cut through from the front surface to the rear surface of resin sheet 1, while connecting portion 4 is left over because that portion is covered by heat-resistant strip 54. Though ditches 2 are also cut through by the laser beam up to the surface of heat-resistant layers 52, the heat-resistant layers still remain there unmelted. Therefore ditch 2 having a bottom end constituted by heat-resistant layer 52 is formed. In this manner, resin sheet 1 as a whole is easily and precisely shaped into the form shown in FIG. 1 by the simple process of laser beam radiation. Accordingly, the resin sheet can be manufactured at a low cost.

Figure 3:
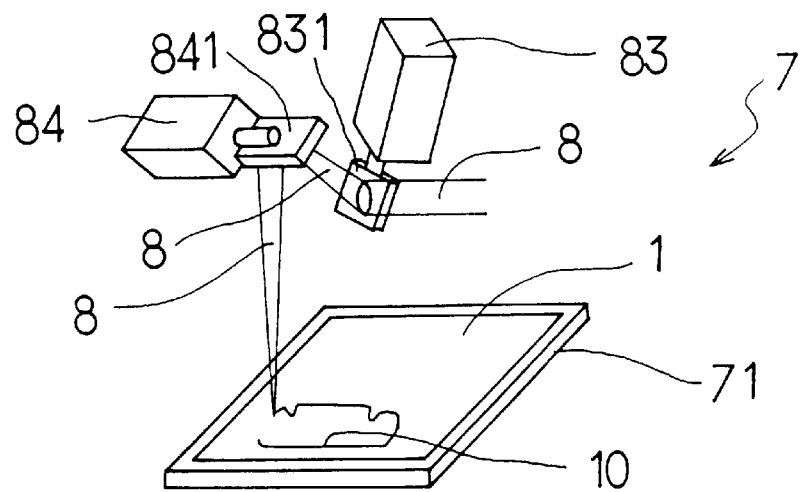
FIG. 3 is a perspective view showing another type of a laser beam radiation apparatus used in a laser beam process shown in FIG. 4.
Figure 4:
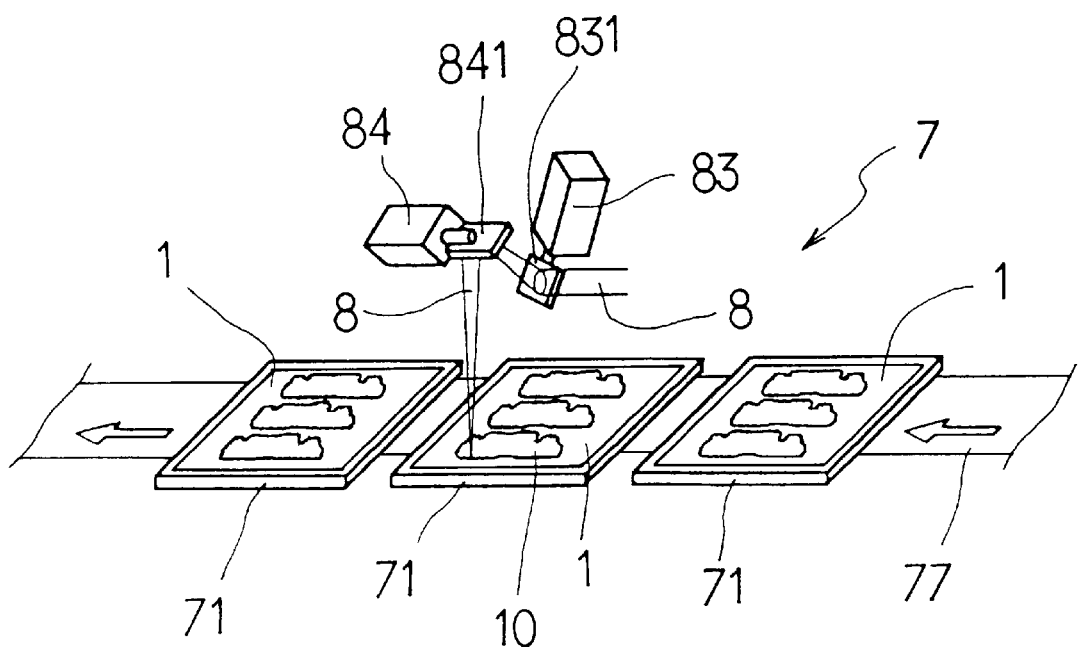
FIG. 4 is a perspective view showing a laser beam process applied to a resin sheet as a second embodiment, in which works are conveyed on a belt conveyor.

Referring to FIGS. 3 and 4, a second embodiment according to the present invention will be described. In this embodiment, the radiation spot of the laser beam is optically moved, as opposed to the process of the first embodiment in which the radiation spot does not move by itself while the beam scanning is carried out by moving the resin sheet mounted on the X-Y table. Laser beam radiation apparatus 7, as shown in FIG. 3, includes a pair of galvanomirrors 831 and 841. The beam spot is controlled according to a predetermined program by means of two galvanomirrors 831 and 841 which are driven by mirror devices 83 and 84, respectively. The source of the laser is the same as in the first embodiment.

As shown in FIG. 4, a series of resin sheets 1 each placed on respective table 71 are moved on conveyor belt 77. When the resin sheet is carried right under laser beam radiation apparatus 7, laser beam 8 scans the resin sheet along scanning line 10 on resin sheet 1. The manner of cutting separation grooves 3 and ditches 2 is the same as in the first embodiment. This process is advantageous when the size of resin sheet 1 is large, because it is not necessary to move the resin sheet on the X-Y table. Also, this process is advantageous when a production volume is large because the conveyor system is easily combined with the laser beam radiation apparatus.

Figure 5A:
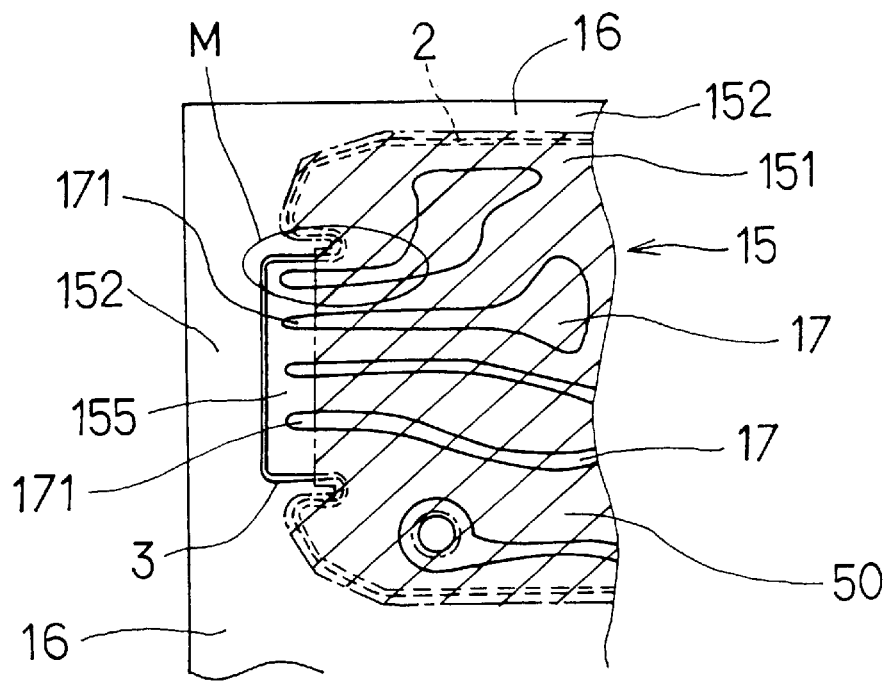
FIG. 5A is a plan view showing a flexible circuit sheet as a third embodiment of the present invention.
Figure 5B:
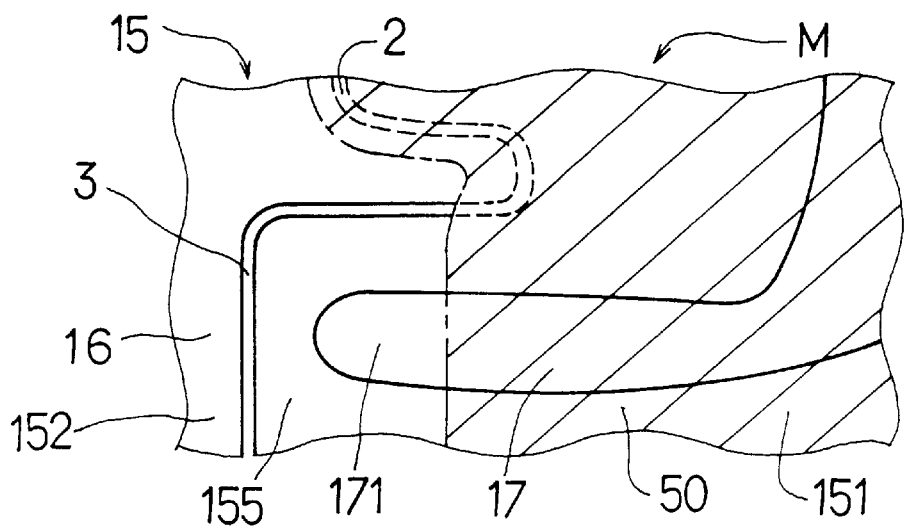
FIG. 5B is a plan view showing a part M shown in FIG. 5A in an enlarged scale.
Figure 6:
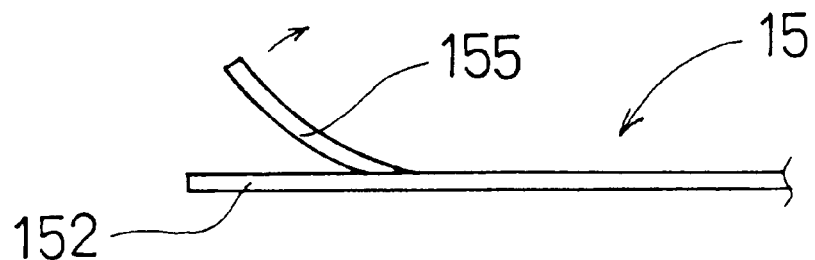
FIG. 6 is a schematic view showing a process of separating a flexible circuit sheet shown in FIG. 5A from a single resin sheet.
Figure 7:
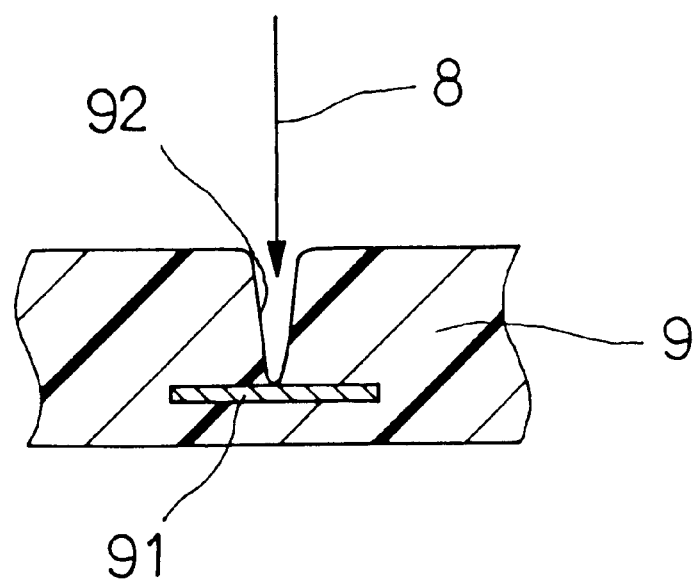
FIG. 7 is a fragmentary cross-sectional view showing a metal strip embedded in a conventional resin sheet.

Referring to FIGS. 5A, 5B and 6, a third embodiment according to the present invention will be described. In this embodiment, flexible circuit sheet 15 used for making electrical connections in an instrument panel of an automotive vehicle is manufactured in the laser beam process combined with a conveyor system as in the second embodiment.

FIG. 5A shows a part of flexible circuit sheet 15 formed on thermoplastic resin film 16, and FIG. 5B is an enlarged view showing an area M encircled in FIG. 5A. Several flexible circuit sheets 15 are formed on a single thermoplastic resin film 16 made of 75 μm thick polyester resin. First, conductor pattern 17 is printed on one surface of thermoplastic resin film, and then resin layer 50 is coated on conductor pattern 17 by screen printing so that the resin layer covers a whole area 151 (a hatched area in the drawing) which includes not only conductor pattern 17 but also fringe area of the conductor pattern where ditch 2 is to be made in a later process. Peripheral area 152 which is removed later as a scrap and lip portion 155 to which conductor tip portion 171 is extended are not covered by resin layer 50. Flexible circuit sheet 15 is encircled and defined by ditch 2 and separation groove. The coated resin layer is heated and hardened. Resin layer 50 is a layer of 13 μm thick epoxy resin. Resin layer 50 serves as a film for electrically insulating each conductor pattern 17 and as a heat-resistant layer (performing the same function as heat-resistant layer 52 in the first embodiment described above).

Thermoplastic resin film 16 having several flexible circuit sheets 15 printed thereon as described above is processed by the laser beam in the same manner as in the second embodiment. That is, thermoplastic resin film 16 is placed on conveyor table 71 as shown in FIG. 4 so that the surface of the film on which nothing is printed faces up toward laser apparatus 7. Laser beam 8 is radiated on the film and continuously scans it along the line forming ditch 2 and separation groove 3. Thus, separation groove 3 is cut through, and ditch 2 is formed. At this stage, individual flexible circuit sheets 15 are not separated from resin film 16 because they are connected by resin layer 50 at the bottom of ditch 2. Therefore, a whole resin film carrying several flexible circuit sheets 15 thereon can be conveyed as a single piece.

After the laser process, individual flexible circuit sheets 15 are separated from thermoplastic resin film 16. Lip portion 155 is lifted up as shown in FIG. 6, so that flexible circuit sheet 15 is peeled off from the resin film by breaking the fragile connection formed by resin layer 50 at the bottom of ditch 2. Thus, peripheral portion 152 to be removed as a scrap and flexible circuit sheet 15 are easily separated from each other.

Since the individual flexible circuit sheets are not separated from each other until they are peeled off, it is easy to carry the resin film as a whole in the laser beam process. Since the connection by resin layer 50 is fragile, separation of each flexible circuit sheet 15 is easily done without damaging any part of the circuit sheet. Since resin layer 50 which is necessary for insulation also performs the function as the heat-resistant layer in the laser beam process, no additional process is required for making the fragile connection which endures the laser beam process. Because of all of the above, the flexible circuit sheet having high quality can be manufactured in a simple process and at a low cost.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of processing a resin sheet with a laser beam, the method comprising:

printing thermosetting resin ink on a first surface of a thermoplastic resin sheet to cover an area where a ditch is to be formed on the thermoplastic resin sheet;

hardening the printed thermosetting resin ink to form a heat-resistant layer;

radiating and scanning a laser beam on a second surface of the thermoplastic resin sheet along a line of the ditch to be formed, the second surface being opposite to the first surface on which the heat-resistant layer is formed; and melting and evaporating a part of resin of the thermoplastic resin sheet with the laser beam to form the ditch, the ditch having a bottom which is closed by the heat-resistant layer.

2. The method of claim 1, further comprising maintaining the laser beam at a constant power throughout said scanning of the laser beam on the second surface of the thermoplastic resin sheet.

3. The method of claim 1, further comprising varying the scanning speed of the laser beam during said scanning of the laser beam on the second surface of the thermoplastic resin sheet.

4. The method of claim 1, further comprising setting the laser beam at a power sufficiently high to perform said melting and evaporating of a part of resin of the thermoplastic resin sheet, but not high enough to melt and evaporate the heat-resistant layer.

5. A method of cutting a resin product having a desired shape from a thermoplastic resin sheet, said method comprising:

printing thermosetting resin ink on a first surface of the thermoplastic resin sheet to cover a part of a line along which the laser beam is to be radiated;

hardening the printed thermosetting resin ink to form a heat-resistant layer;

cutting the resin product from the thermoplastic resin sheet by radiating a laser beam on a second surface of the thermoplastic resin sheet along the line to melt and evaporate a portion of the thermoplastic resin sheet while maintaining theheat-resistant layer against the first surface, the heat-resistant layer bridging the cut resin product to a remaining portion of the thermoplastic resin sheet; and separating the resin product from the remaining portion of the thermoplastic resin sheet by shearing the heat-resistant layer.

6. The method of claim 5, wherein conductor patterns are formed on the first surface of the resin sheet, and further wherein the thermosetting resin ink covers the surface of the conductor patterns so that the heat-resistant layer formed from the thermosetting resin ink serves as an insulating film of the conductor patterns.

* * * * *